(12) United States Patent
Almog et al.

(10) Patent No.: US 10,335,702 B2
(45) Date of Patent: Jul. 2, 2019

(54) CIRCUIT BUILDING SYSTEM

(71) Applicant: BRIXO SMART TOYS LTD., Rehovot (IL)

(72) Inventors: Boaz Almog, Rehovot (IL); Amir Saraf, Yavne (IL)

(73) Assignee: Brixo Smart Toys Ltd., Rehobot (IL)

(*) Notice: Subject to any disclaimer, the term of this patent is extended or adjusted under 35 U.S.C. 154(b) by 0 days.

(21) Appl. No.: 15/745,798

(22) PCT Filed: Jul. 19, 2016

(86) PCT No.: PCT/IL2016/050784
§ 371 (c)(1),
(2) Date: Jan. 18, 2018

(87) PCT Pub. No.: WO2017/013647
PCT Pub. Date: Jan. 26, 2017

(65) Prior Publication Data
US 2018/0221782 A1    Aug. 9, 2018

(30) Foreign Application Priority Data
Jul. 20, 2015    (IL) .......................................... 240042

(51) Int. Cl.
*A63H 33/26*    (2006.01)
*A63H 33/08*    (2006.01)
(Continued)

(52) U.S. Cl.
CPC ......... *A63H 33/086* (2013.01); *A63H 33/042* (2013.01); *A63H 33/046* (2013.01); *A63H 33/26* (2013.01); *H03K 19/1736* (2013.01)

(58) Field of Classification Search
CPC .. A63H 33/042; A63H 33/046; A63H 33/086; A63H 33/26
(Continued)

(56) References Cited

U.S. PATENT DOCUMENTS 5,742,486 A * 4/1998 Yangkuai ............. A63H 33/042
361/807
6,443,796 B1 * 9/2002 Shackelford ......... A63H 33/042
273/237
(Continued)

FOREIGN PATENT DOCUMENTS

DE    202009013913    1/2010
FR    2576962    8/1986
(Continued)

OTHER PUBLICATIONS

Search Report and Written Opinion for corresponding international application PCT/IL16/50784 dated Oct. 13, 2016.
(Continued)

*Primary Examiner* — Alexander R Niconovich
(74) *Attorney, Agent, or Firm* — Reed Smith LLP

(57) ABSTRACT

The present invention provides a circuit building system, comprising a plurality of electrically conductive and detachably and mechanically interconnectable blocks that extend between a low voltage power source and one or more electrically active members and that are selectively interconnected in such a way to build a closable electric block-defined circuit through which current is flowable to activate said one or more electrically active members and by which a triggerable action is generatable independently of a separate data line, wherein a first block of said plurality of electrically conductive blocks is an electrically switchable block that comprises first and second electrically conductive terminal members by which said activating current, in response to said triggerable action, is selectively flowable to an adjacent block of the plurality of blocks in abutting and electricity conducting relation therewith.

19 Claims, 6 Drawing Sheets

(51) Int. Cl.
*A63H 33/04* (2006.01)
*H03K 19/173* (2006.01)

(58) Field of Classification Search
USPC ............... 446/91, 108, 118, 129, 130, 484; 434/224
See application file for complete search history.

(56) References Cited

U.S. PATENT DOCUMENTS

| | | | | |
|---|---|---|---|---|
| 7,144,255 | B2* | 12/2006 | Seymour | H01R 13/627 439/49 |
| 7,708,615 | B2* | 5/2010 | Munch | A63H 33/042 446/484 |
| 8,221,182 | B2* | 7/2012 | Seymour | A63H 33/04 446/120 |
| 8,690,631 | B2* | 4/2014 | Nag | A63H 33/042 446/125 |
| 8,911,275 | B2* | 12/2014 | Maddocks | A63H 33/042 446/91 |
| 9,168,464 | B2* | 10/2015 | Karunaratne | A63H 33/086 |
| 9,303,950 | B2* | 4/2016 | Fuller | F41C 33/06 |
| 9,419,378 | B2* | 8/2016 | Bdeir | H01R 13/6205 |
| 9,597,607 | B2* | 3/2017 | Bdeir | H01R 13/6205 |
| 9,889,388 | B2* | 2/2018 | Liu | A63H 33/042 |
| 2006/0139149 | A1* | 6/2006 | Faro | G07C 9/00103 340/5.73 |
| 2014/0170929 | A1* | 6/2014 | Lipman | A63H 3/00 446/175 |

FOREIGN PATENT DOCUMENTS

| | | |
|---|---|---|
| WO | 2008153400 | 12/2008 |
| WO | 2015033340 | 3/2015 |

OTHER PUBLICATIONS

Partial International Search Report for corresponding International Application No. PCT/IB17/001024 dated Dec. 28, 2017.

* cited by examiner

CIRCUIT BUILDING SYSTEM

CROSS-REFERENCE TO RELATED APPLICATION

This application is a 371 National Stage of International. Application No. PCT/IL2016/50784, filed Jul. 19, 2016, which was published as International Publication No. WO 2017/013647, and which claims the benefit under 35 U.S.C. § 119(e) of the earlier filing date of Israel Patent Application No. 240042 filed on Jul. 20, 2015, the disclosure of which is incorporated by reference herein.

FIELD OF THE INVENTION

The present invention relates to the field of modular elements. More particularly, the invention relates to releasably interconnecting toy building elements (hereinafter referred to as "blocks") that selectively direct the flow of electricity in switchable fashion through other electrically conducting blocks or active elements of a circuit building system.

BACKGROUND OF THE INVENTION

Connectable blocks, such as the building elements provided by LEGO®, allow one to build three dimensional structures and provide a unique educational experience. Playing with such blocks develops skills such as 3D vision, creativity, engineering, role-playing and more. The common toy blocks have been supplemented with dedicated building elements with either a specific appearance or a mechanical or electrical function to enhance the play value. Such functions include e.g. motors, switches and lamps, but also programmable processors that accept input from sensors and can activate function elements in response to received sensor inputs. In some cases, a state-of-the-art electronic system is incorporated in the building elements, to allow programmable robotic construction, remote control actions and more, such as the ROBOTICS INVENTION SYSTEM kit manufactured by LEGO MINDSTORMS. However, the electronic aspects of these kits cannot be easily exploited by the user and combining multiple electric components is at best limited.

Today, many connectable toy blocks are made of a non-conductive plastic material, such as Acrylonitrile Butadiene Styrene (ABS). These are designed in such a way that two blocks are easily connectable to each other as well as easily disassembled. Many building kits allow the construction of highly sophisticated 3D models as along with simple shapes. Some kits combine electric elements such as motors, lights and sensors, by mechanically attaching them to existing blocks. In some instances, electric components are embedded or encased in a plastic block, which allows direct attachment to other blocks In such electronic sets all the wiring is done by regular wires that are not a part of the construction. Electrically connecting the circuit is straightforward and simplified connectors are provided to plug-in the wires into each of the components. The electric circuitry is invisible to the user in the sense that the wires usually come in pairs and the only construction experience is connecting parts together. The educational experience is limited as the user does not learn much about electronics and electric circuits; moreover, it is limited by the need to connect actual wires, which may become entangled, limit the mechanical movement and are unpleasing to the eye. Furthermore, such elements do not include basic electronic components such as capacitors, coils, resistors, etc.

Scientific educational kits may be provided as electronic kits. These usually comprise specific theme-based, stand-alone kits, in which the user experience involves connecting an electrical circuit that performs a certain function. Examples of such kits include a solar energy kit (solar powered vehicles), electric water fountains, electric alarms, electric turbines, etc. Many kits use a plastic board onto which electric wires are connected, either directly or through mechanical devices (springs). Electric components can be mechanically attached to the board. However, such electronic kits are limited because the user experience is limited to placing components and connecting wires in a way that the path through which current flows is not visually evident. The result is usually an entanglement of wires that completely masks the circuit structure and its functionality. Thus, the educational value and learning experience is at best limited. Moreover, the components of each kit cannot be used in other setups or other kits and are usually limited to the specific kit for which they were designed.

Some prior-art publications disclose a variety of arrangements for providing conductive toy blocks, such as U.S. Pat. Nos. 3,346,775, 3,553,883, 4,556,393, 6,805,605 and CH 455606A. However, such arrangements require contacts or conductive pins to be embedded inside the toy blocks.

U.S. Pat. No. 8,821,182 discloses a three-dimensional electro-mechanical system for making a mechanical structure using snap-together parts and for demonstrating principles required in making electronic circuits incorporated in the structure. However, this system lacks any sensors by which an educationally informative and a self-initiated action can be triggered.

US 2013/0343025 discloses a modular electronic building system that teaches the logic of programming and circuit building without requiring expertise. The modular block building system consists of pre-assembled and interconnected printed circuit boards. Power, signal and ground lines are interconnected between and throughout all modules, so that a plurality of components are connected to the lines in parallel. Each block performs one or more discrete functions, and the blocks can be combined to create larger circuits. Some blocks respond to external events, some are pre-programmed, and others pass or block current. The current is affected when a sensor module, for example, is placed between a first module and a second module.

Although this modular electronic building system contributes to the understanding of how logic circuits are built, users are unable to identify electric components or to learn how electricity flows due to the large number of components that are included in the electronic building system. Following a switching event in response to sensor detection, data is transmitted through the signal line in order to reset the switch, further adding to the complexity of the electronic building system.

It is therefore an object of the present invention to provide a toy block which is capable of selectively directing the flow of electricity through adjoining blocks or active elements.

It is another object of the present invention to provide an electrically switchable toy block that facilitates a child-initiated triggering action without need of an independent data line in addition to the power source.

It is another object of the present invention to provide an educational tool that allows electric components to be interconnected and detached without use of wired connections.

It is yet another object of the present invention to provide an educational tool that teaches child users to identify and isolate electric components and to learn the fundamentals of electrical circuits in a visually intuitive fashion.

Other objects and advantages of the invention will become apparent as the description proceeds.

SUMMARY OF THE INVENTION

The present invention provides a circuit building system, comprising a plurality of electrically conductive and detachably and mechanically interconnectable blocks that extend between a low voltage power source and one or more electrically active members and that are selectively interconnected in such a way to build a closable electric block-defined circuit through which current is flowable to activate said one or more electrically active members and by which a triggerable action is generatable independently of a separate data line, wherein a first block of said plurality of electrically conductive blocks is an electrically switchable block that comprises first and second electrically conductive terminal members by which said activating current, in response to said triggerable action, is selectively flowable to an adjacent block of the plurality of blocks in abutting and electricity conducting relation therewith.

The circuit building system is generally, but not necessarily, an educational tool for demonstrating the principles of circuitry. Each of the blocks may be configured with a single electric component of the electric block-derived circuit that is identifiable and isolatable, for example a resistor block, a battery block, a conductive block, and an electrically switchable block. The user sees that the one or more electrically active members are activated when the plurality of blocks are satisfactorily interconnected according to a user-selected configuration to close the circuit and that the one or more electrically active members are deactivated when one of the blocks is removed to open the circuit.

The user is able to able acquire the satisfaction of being responsible for a user initiated or a sensor responsive triggerable action, as well as learning the cause of the triggerable action.

The switchable block also comprises an operating mechanism responsive to the triggerable action for permitting flow of the activating current between the first and second terminal members.

In one aspect, the operating mechanism comprises first and second separable contacts electrically connected to the first and second terminal members, respectively, and a magnetizable switch interposed between said first and second contacts, said first and second contacts being closable under the influence of a magnetic field of a permanent magnet which has been brought in close proximity to said magnetizable switch and being openable following distancing of said permanent magnet from said magnetizable switch.

In one aspect, the operating mechanism comprises an integrated circuit configured with logic circuits that are operable in both a dormant state and an active state, the activating current being transmitted by the operating mechanism between the first and second terminal members at a magnitude that is sufficient to activate the one or more electrically active members when the logic circuits are set to the active state. Leakage current is continuously flowable through the block-defined circuit, when the logic circuits are set to the dormant state, at a magnitude that is less than what is needed to activate the one or more electrically active members but sufficiently high to enable performance of the triggerable action when a triggering command is received by the logic circuits.

In one aspect, the integrated circuit comprises a processor, a switching unit interposed between the first and second terminal members and also connected to said processor, and a limiting resistor which has a sufficiently high resistance to reduce the current received from the first terminal member and transmitted to the second terminal member to the dormant state magnitude. The processor is operable to transmit a reconfiguring command to the switching unit for bypassing the limiting resistor such that the activating current is received by the second terminal member.

In one aspect, a second block of the plurality of electrically conductive blocks comprises the first and second terminal members and one or more contact enhancing elements, to maintain an adjacent first or second block in abutting and electricity conducting relation with each other. The second block may have a central portion made from a non-conductive material in order to electrically isolate the first and second terminal members from each other.

In one aspect, a second block of the plurality of electrically conductive blocks is a wholly conductive block, and further comprises one or more contact enhancing elements, to maintain an adjacent first or second block in abutting and electricity conducting relation with each other.

In one aspect, the circuit building system further comprises a short-range receiver in data communication with the logic circuits to which the triggering command, e.g. an RF or IR command, is remotely transmittable. The short-range receiver may be provided with the integrated circuit, or may be housed within a third block which is interconnectable with the first block.

In one aspect, the triggering command is transmittable from a sensor to the processor. The sensor may be housed within a fourth block which is interconnectable with the first block, or may be housed within the first block.

In one aspect, the low voltage power source is a battery or a DC transformer.

In one aspect, the electric block-defined circuit comprises a plurality of parallel sub-circuits, each of said plurality of sub-circuits comprising a corresponding electrically switchable block by which the activating current is selectively deliverable therethrough. A first sub-circuit may comprise a first electrically active member that is different than a second electrically active member associated with a second sub-circuit.

DETAILED DESCRIPTION OF PREFERRED EMBODIMENTS

The present invention is related to a novel releasably interconnectable toy block that provides electrical switching capabilities. A child user building a structure with the electrically switchable block will acquire the satisfaction of being able to initiate desired electrically caused actions such as a controlled movement or the emission of lights or sounds, as well as being engaged in an educational activity by which the fundamentals of electrical circuits are learned.

The following description relates to a rectilinear block, but it will be appreciated that the invention is also applicable to a block of any other size or shape.

Figure 1:
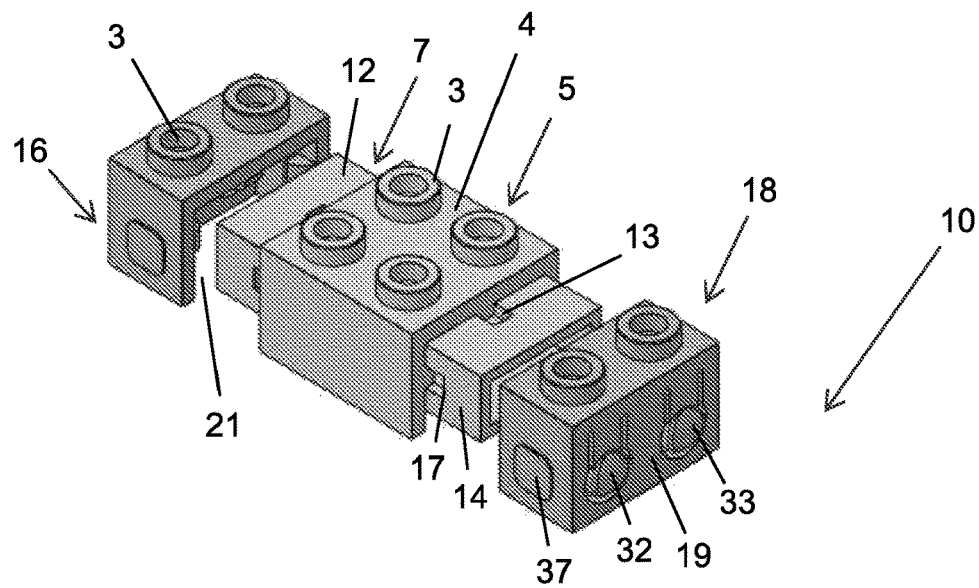
FIG. 1 is a perspective exploded view from the top of an interconnectable and electrically conductive block, according to one embodiment of the invention.
Figure 2:
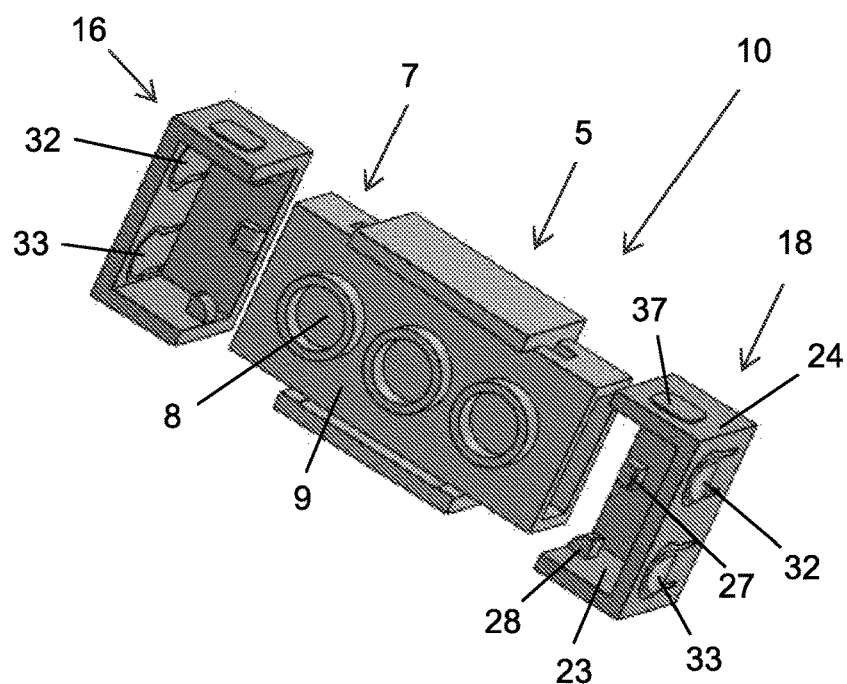
FIG. 2 is a perspective exploded view from the bottom of the conductive block of FIG. 1.

FIGS. 1 and 2 illustrate an interconnectable and electrically conductive block 10, shown in exploded view, according to one embodiment of the invention. Block 10 comprises central portion 5 having an L-shaped profile and configured with male engagement elements 3 protruding upwardly from its upper square surface 4, a rectangular interface element 7 joined to central portion 5 below surface 4 and configured at its bottom surface 9 with female engagement elements 8, and two opposed electrically conductive terminal members 16 and 18 that are securable to the two longitudinal ends 12 and 14, respectively, of interface element 7. In addition to being securable to terminal members 16 and 18, interface element 7 is generally, but not necessarily, hollow to house therewithin circuitry for facilitating electrical switching capabilities, as will be described hereinafter.

The directional terms described herein such as "upper" and "below" relate to a specific orientation whereby surface 4 overlies interface element 7, but it will be appreciated that any other relative orientation is also within the scope of the invention.

The male and female engagement elements may be of any type well known to those skilled in the art, and some or all of the illustrated male engagement elements may be replaced with female engagement elements, or some or all of the illustrated female engagement elements may be replaced with male engagement elements.

Each of terminal members 16 and 18 has a closed longitudinally oriented outer wall 19, an open longitudinally oriented inner end 21 for receiving a corresponding longitudinal end of interface element 7, and parallel sidewalls 23 and 24 defining the opening of open end 21. Male engagement elements 3 also protrude upwardly from the upper surface of terminal members 16 and 18. In order to secure interface element 7 to terminal members 16 and 18, each longitudinal end of the interface element may be configured with recesses 13 and 17 at upper and side surfaces thereof, respectively, with which complementary protrusions 27 and 28 protruding from an inner surface of a terminal member are engageable. Block 10 becomes a monolithic assembly after interface element 7 is secured to terminal members 16 and 18.

Terminal members 16 and 18 may be converted into electrically conductive members by the manner disclosed in copending International Publication No. WO 2015/033340. That is, they may be made from a base plastic material and coated with one or more metallic conductive layers having excellent electrical conductivity, for example three separate copper, nickel and chrome layers, such as by electroplating techniques, lithography techniques for masking portions of the terminal members, etching techniques, or by adhesive or mechanically attachment. The total thickness of the coating may range from 1-100 microns, be resistant to erosion and have a metallic shine.

Alternatively, terminal members 16 and 18 may be made of a single metallic and therefore electrically conductive layer, or have electrically conductive pins that are embedded within the walls of the terminal members.

Central portion 5 and interface element 7 are preferably manufactured from a non-conductive plastic material, e.g. Acrylonitrile Butadiene Styrene (ABS), in order to electrically isolate terminal members 16 and 18 from each other. The isolating interface element 7 therefore provides electrically conductive block 10 with two separate channels, through each of which current of different polarity is able to flow.

Terminal members 16 and 18 may also be formed with flexible and laterally spaced, contact enhancing elements 32 and 33, to maintain longitudinally adjacent blocks in contact, as also disclosed in copending International Publication No. WO 2015/033340. Contact enhancing elements 32 and 33 may be configured as a flexible and elastic arm that is connected to outer wall 19, yet most of its periphery is separated from outer wall 19, so as to be biased in a disposition that normally extends obliquely from outer wall 19. Despite the conduction resisting gap normally existing between two longitudinally adjacent blocks that are placed one next to the other on a suitable baseplate, the contact enhancing elements protruding into the gap set two terminal members of two longitudinally adjacent blocks, respectively, in abutting and electricity conducting relation with each other.

A contact enhancing element 37 may also be flexibly connected to a laterally oriented sidewall 24 to set two terminal members of two laterally adjacent blocks, respectively, in abutting and electricity conducting relation with each other.

Figure 3:
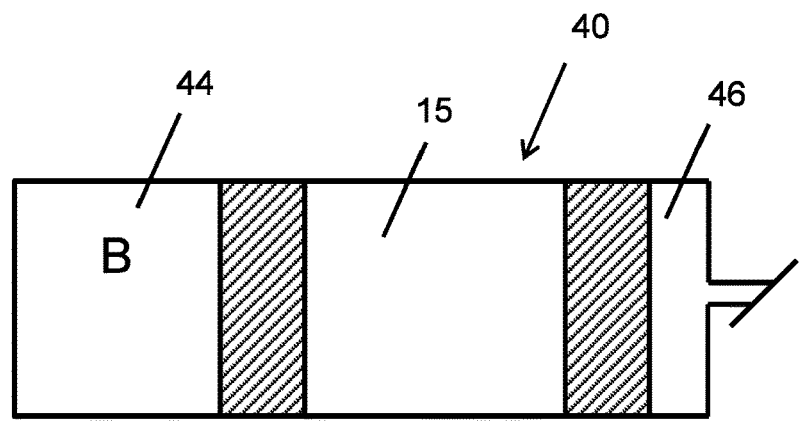
FIG. 3 schematically illustrates a block arrangement, by which the flow of current is prevented.
Figure 4:
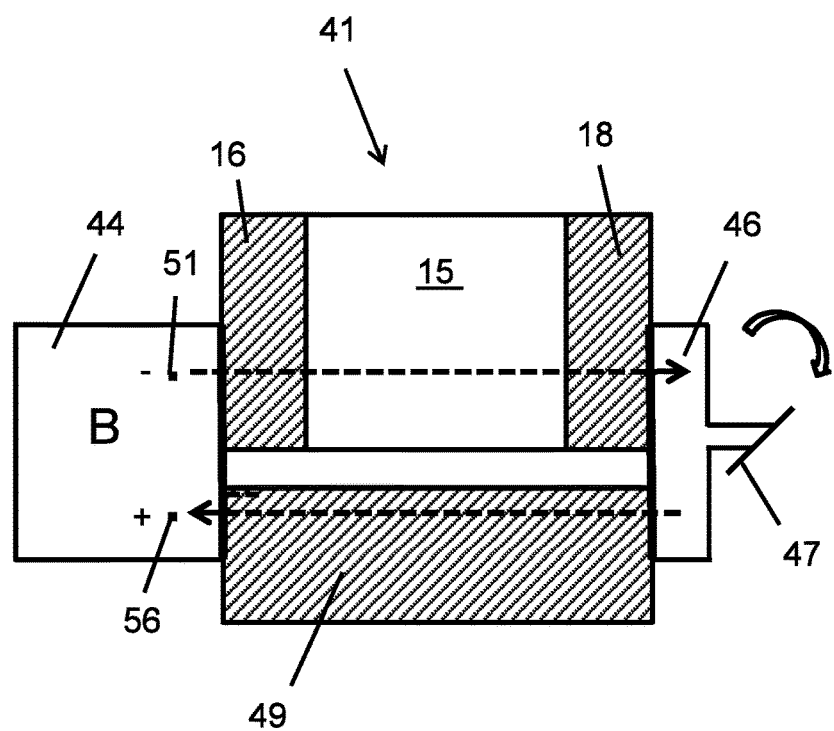
FIG. 4 schematically illustrates a block arrangement in addition to the block arrangement of FIG. 3, by which current flows to an electrically active member.

As an introduction, FIGS. 3 and 4 illustrate an electrical circuit that is constructible by a child user using electrically switchable block 15. An incomplete circuit is shown in FIG. 3, while FIG. 4 illustrates a block arrangement that supplements the block arrangement of FIG. 3 to close the circuit and to activate a component.

Electrically switchable block 15 is configured similarly to block 10 of FIG. 1, being configured with two electrically conductive terminal members and a central interface element interposed between the two terminal members. In addition, electrically switchable block 15 comprises an operating mechanism housed in the central interface element, as will be described hereinafter, for selectively permitting flow of current between the two terminal members, to visually present to a child user some fundamentals of electrical circuitry. The electrically conductive elements are schematically illustrated with hatching.

In block arrangement 40 of FIG. 3, two electrically active blocks, for example a battery block 44 for generating low voltage power e.g. 9V and a propeller block 46 as shown, or a block in which is housed any other suitable electrically active component such as a motor and light source, are placed in abutting and electricity conducting relation with electrically switchable block 15. The electrically active blocks, which may be configured without a printed circuit board, have at least one contact enhancing element for engagement with electrically switchable block 15. If so desired, battery block 44 may be provided with a current limiter. Any other low voltage power source such as a low voltage DC transformer may also be used. The electrically active component is generally encased within a plastic compartment and is electrically connected to the contact enhancing element, such as by wiring, embedded metal conductors, soldering, or mechanical attachment, e.g. with a screw.

Even though electrically switchable block 15 is in electricity conducting relation with both battery block 44 and a propeller block 46, the child user realizes that propeller 47 is not rotated, of course due to the presence of the central insulating portion which prevents the flow of electricity from the battery to the propeller.

In block arrangement 41 of FIG. 4, wholly conductive block 49 is positioned in parallel with electrically switchable block 15, such that both blocks 15 and 49 are interposed between, and in electricity conducting relation with, battery block 44 and propeller block 46. To facilitate such engagement, each of battery block 44 and propeller block 46 may be configured with two contact enhancing elements, in order to be in abutting and electricity conducting relation with two blocks simultaneously.

Current is therefore flowable between negative terminal 51 and positive terminal 56 of battery block 44, after passing consecutively through electrically switchable block 15, including terminal members 16 and 18 thereof, propeller block 46, and wholly conductive block 49, as schematically indicated by the dashed lines. The current flows in an opposite direction through electrically switchable block 15 than through wholly conductive block 49. Due to the flow of current, propeller 47 begins to rotate. The child user accordingly realizes that the propeller rotates due to the formation of a closed circuit between battery block 44 and propeller block 46.

Figure 5:
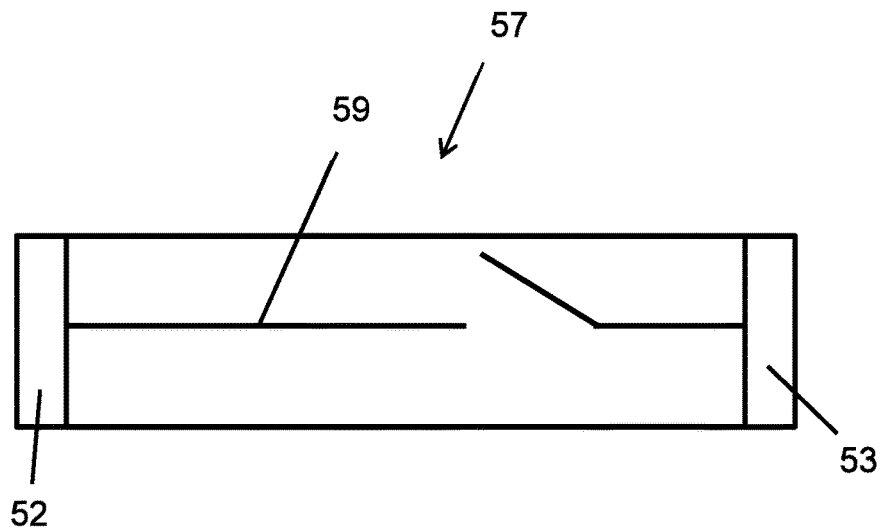
FIG. 5 schematically illustrates a magnetizable switch which is housed within an interface element of an electrically switchable block.

Interface element 57 is schematically illustrated in FIG. 5. A magnetizable switch 59, for example a reed switch, is housed within the hollow sealed interior of interface element 57. Switch 59 is connected to opposed conductive elements 52 and 53, which in turn are brought in electric contact with the terminal members upon securement of the interface element. Consequently, current is flowable between conductive elements 52 and 53 when switch 59 is closed.

Figure 6:
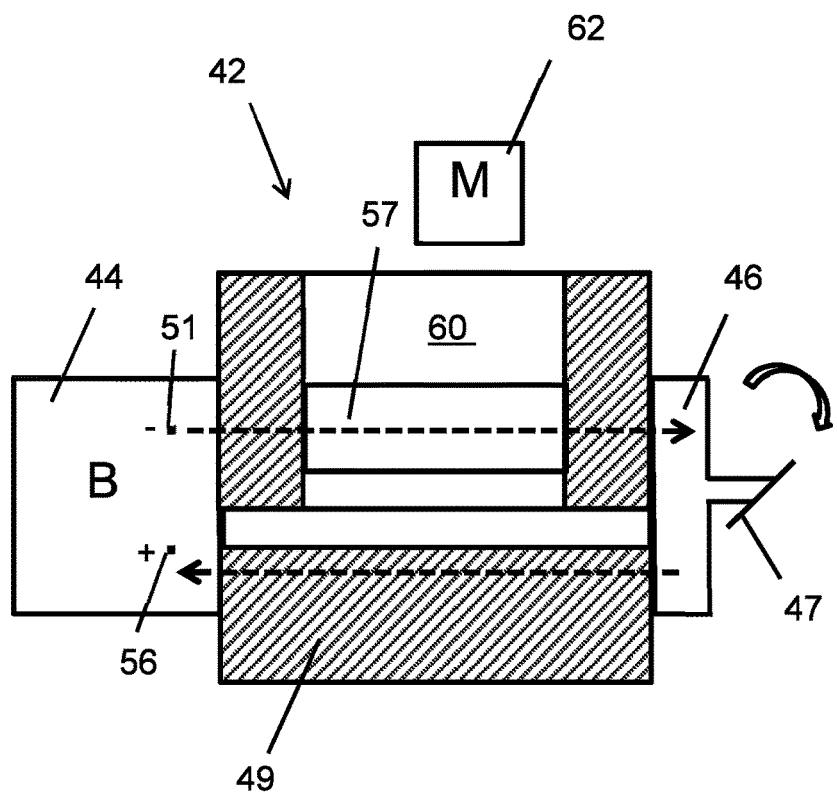
FIG. 6 schematically illustrates a block arrangement for powering an electrically active member using the magnetizable switch of FIG. 5.

As shown in FIG. 6, a block arrangement 42 including wholly conductive block 49 may be used to power electrically active block 46 when electrically switchable block 60 comprising interface element 57 is used. When a child user brings a permanent magnet 62 in close proximity to interface element 57, two contacts functioning as a sensor to sense the approaching magnetic field are brought together to actuate the switch and close the circuit, causing propeller 47 to rotate. The child user is thus provided with a learning tool to understand the uses of a magnetic field to actuate a component without being in direct contact therewith, and at the same time acquires the satisfaction of being able to initiate a triggering action.

Figure 7:
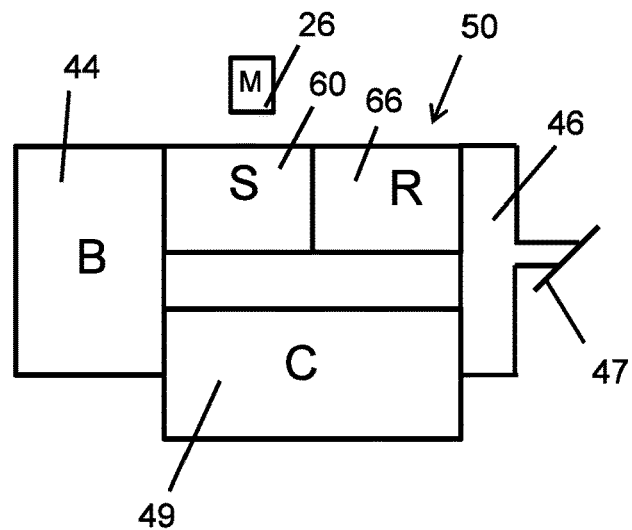
FIG. 7 schematically illustrates a block arrangement for powering an electrically active member using a resistor block.

In block arrangement 50 of FIG. 7, a resistor block 66 is positioned between switchable block 60 and electrically active block 46. In resistor block 66, a resistor is electrically connected to the two opposed terminal members thereof, one of which is electrically connectable with a terminal member of the adjacent switchable block 60. Current is therefore flowable in one direction through resistor block 66, conducting for example the current which flows from negative terminal 51 of battery block 44 (FIG. 6). Current flows from resistor block 66 to electrically active block 46, and then from electrically active block 46 to wholly conductive block 49. To complete the circuit, current is flowable from wholly conductive block 49 to the positive terminal of battery block 44.

When the child user brings permanent magnet 62 in close proximity to the interface element of block 60, the circuit becomes closed and the child user realizes that propeller 47 rotates at a slower speed than with respect to the block arrangement in FIG. 6 due to the influence of resistor block 66. When another resistor block is positioned between blocks 46 and 66, propeller 47 will rotate at even a slower speed, helping the child user to understand that a resistor causes current of a smaller magnitude to flow to electrically active block 46.

In one embodiment, resistor block 66 comprises a potentiometer by which the child user is able to selectively adjust the resistance, for example by means of a small dial, and to thereby provide a desired output.

A series circuit is thus produced by which each component can be easily identified and isolated. When any of the components are removed, for example resistor block 66, the circuit becomes opened and propeller 47 will stop rotating. The removed component can be easily replaced to cause the propeller to rotate once again.

Figure 8:
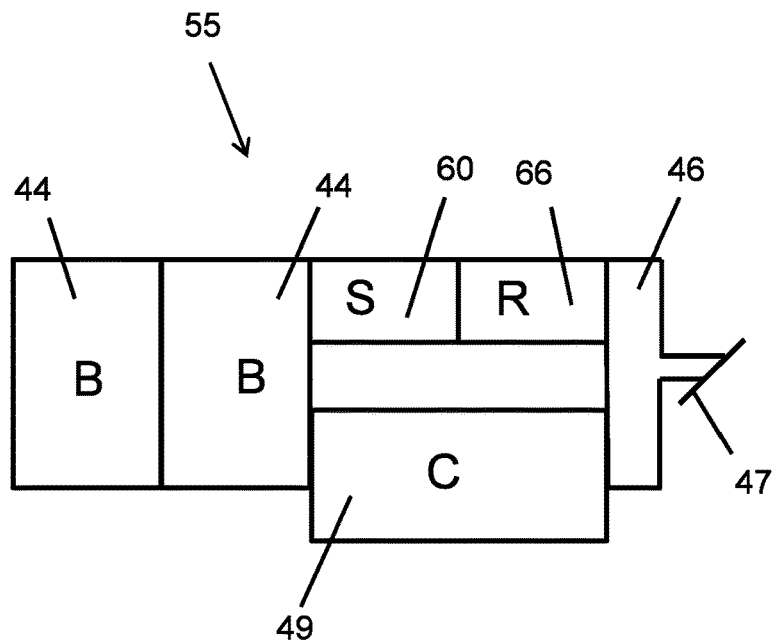
FIG. 8 schematically illustrates a block arrangement for powering an electrically active member using two battery members.

As shown in FIG. 8, the child user will understand that propeller 47 may be caused to rotate at a faster speed by adding a second battery block 44 to form block arrangement 55.

It will be appreciated that the child user may add many different types of electrical components, or numbers of a given component, to the series circuit.

Figure 9:
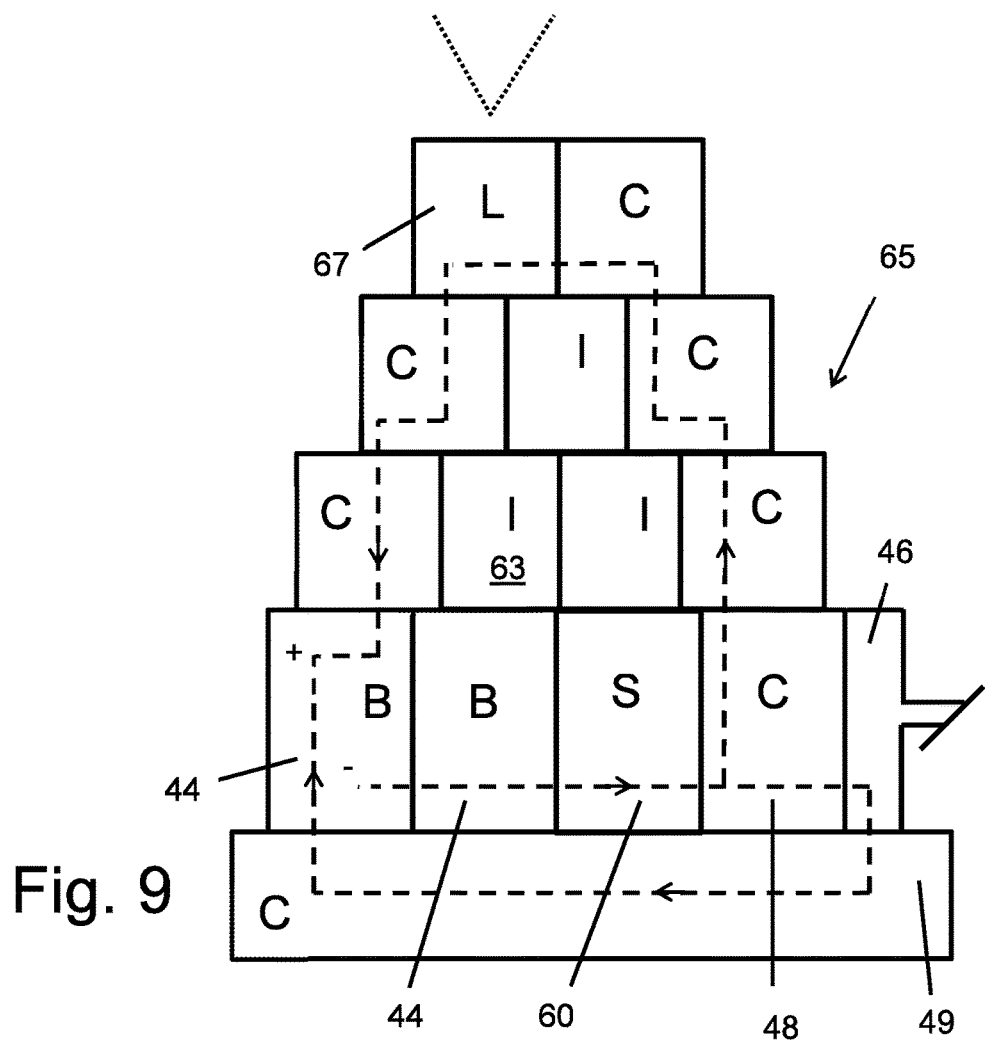
FIG. 9 schematically illustrates a block arrangement for powering two electrically active members.

As shown in FIG. 9, a circuit using interconnected blocks may assume any desired configuration. For example, the illustrated block arrangement 65 may be of a gradually increasing height. A wholly conductive block 48 positioned on the second to bottom level of the block arrangement allows the current flowing from switchable block 60 to branch into two directions: (1) towards block 46 in order to power propeller 47, from which it returns to battery block 44 via wholly conductive block 49 positioned on the bottommost level, and (2) towards a plurality of wholly conductive blocks 48 thereabove, each of which being positioned on a different level of the block arrangement, in order to conduct electricity to light bearing block 67 located on the uppermost level, from which it returns to battery block 44. To accommodate this block arrangement, battery block 44 may be configured with three terminal members. A plurality of wholly insulating blocks 63 are also selectively positioned throughout block arrangement 65 in order to urge the flow of current in a desired direction.

The various blocks may be color coded, or differentiated in any other suitable way, to help identify the function of each block. To assist the child user in determining the direction of current flow, each block through which current flows may become illuminated, or be provided with any other suitable indication means.

Figure 10:
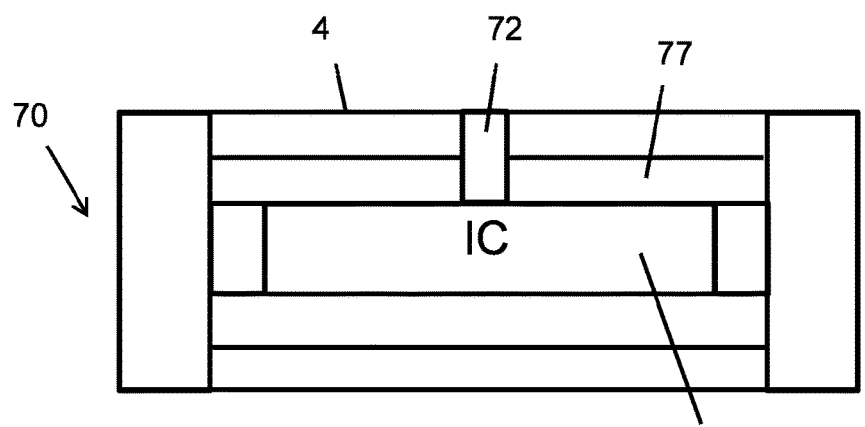
FIG. 10 schematically illustrates an electrically switchable block comprising an integrated circuit.

As schematically illustrated in FIG. 10, a block 70 may be an actively switchable block for performing more complicated operations. Interface element 77 comprises an integrated circuit (IC) 79 adapted to close a circuit in response to a predetermined event. For example, IC 79 configured with a timing component may be preprogrammed to close the circuit at a predetermined time. Alternatively, IC 79 comprises a sensor 72, such as an optical sensor for sensing ambient light passing through an aperture formed in the upper surface 4 of the central portion. When a playing piece, or any other object of interest, is passed over the optical sensor, a predetermined level of darkness is sensed and the circuit is caused to be closed.

Switchable block 70 is also operational in conjunction with any of the block arrangements described above, mutatis mutandis.

Although sensor 72 is shown to be integral with switchable block 70, it will be appreciated that sensor 72 may be configured as a separate block that is interconnectable with block 70 while the sensor is in data communication with IC 79.

The logic circuits of IC 79 are operational to sense a user interaction only when current is constantly flowing and IC 79 is active. To ensure that a user manipulating block 70 will be able to initiate a triggering action whenever desired, IC 79 operates in two different states—in a dormant state and an active state. During the dormant state, a small leakage current continuously flows in the IC and sensor 72 is constantly monitored. The level of the leakage current is less than what is needed to activate the electrically active component, but sufficiently high to keep IC 79 in the dormant state in anticipation to receive a triggering command. The leakage current typically ranges from 1-3 mA.

After the triggering command is made, such as a light or sound related command, IC 79 is set to the active state to permit the current transmitted through switchable block 70 to be of a sufficiently high magnitude for activating the electrically active component.

The triggering command may be transmitted from a remote control device such as a smartphone on which is running a dedicated application for operating IC 79. To accommodate such remote operation, IC 79 may comprise a short-range transceiver, e.g. a Bluetooth transceiver, in data communication with the logic circuits. Alternatively, the short-range transceiver capable of being set in data communication with the logic circuits may be housed in a block interconnectable with switchable block 70.

Many different electrically active components may be employed. For example, when the electrically active component is a LED, a first resistor may be deployed in series with the LED to reduce the current transmitted thereto so as to increase the LED longevity, and a second resistor may be deployed in parallel to the first resistor to further reduce the current flowing to the LED and to thereby prevent its activation in the dormant state.

Figure 11:
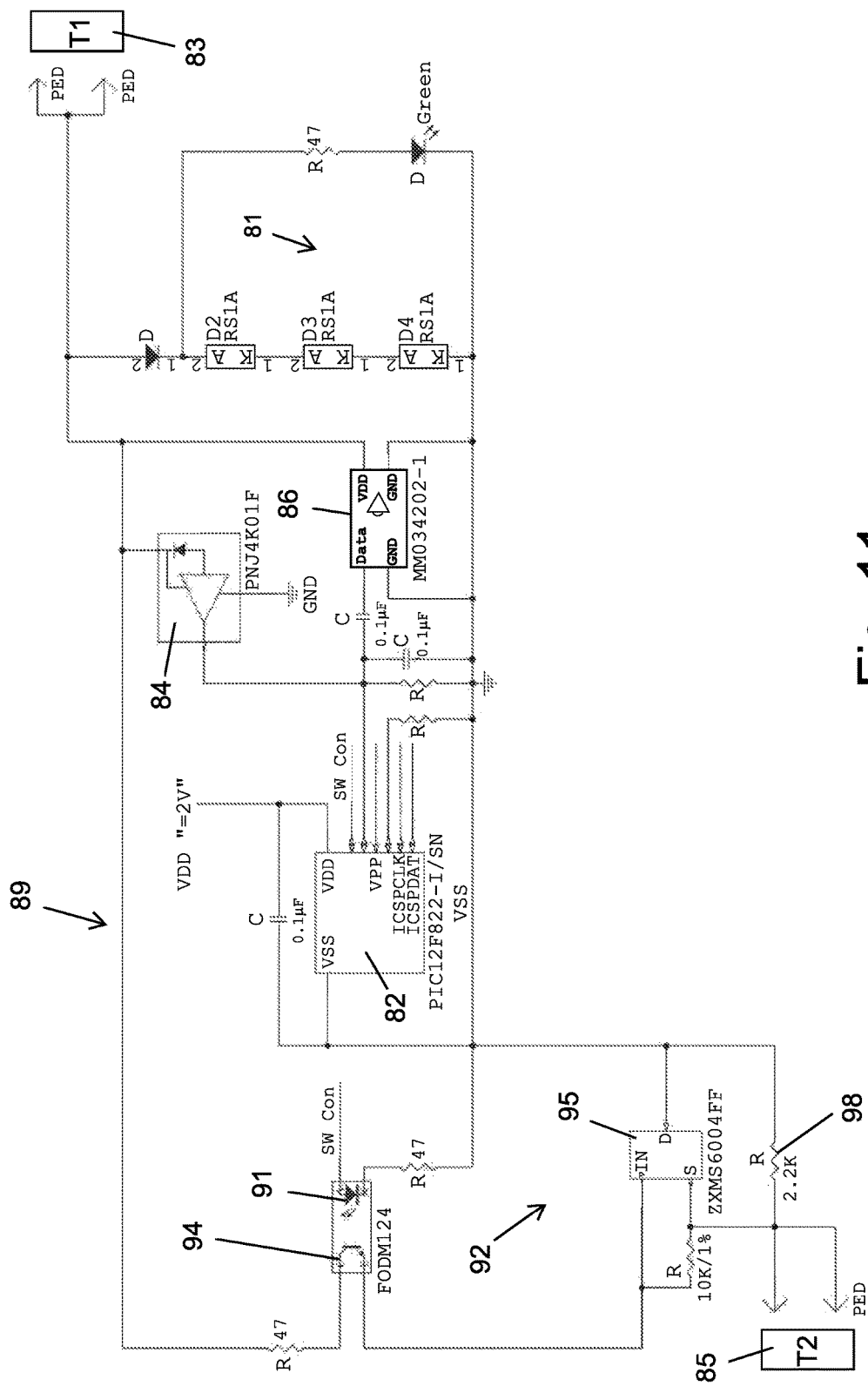
FIG. 11 is an exemplary electrical wiring diagram of the integrated circuit of FIG. 10.

FIG. 11 illustrates an exemplary electrical wiring diagram for an IC 89 suitable for performing a child initiated triggering action. IC 89 comprises indication lights 81, processor 82, a light sensor 84 and microphone 86 connected in parallel to processor 82 and receiving current from first terminal member 83, a switching unit 92 interposed between first 83 and second 85 terminal members and also connected to processor 82, and a limiting resistor 98. It will be appreciated that only one of light sensor 84 and microphone 86, or any other sensor, may be employed. The sensor may also be separate from IC 89, for example configured as a block.

Switching unit 92 comprises switch 95 for normally delivering current received from first terminal member 83 to limiting resistor 98, which has a sufficiently high resistance to limit the current to a dormant state value, so that the low dormant state current will flow to second terminal member 85 without being able to activate the electrically active component. Limiting resistor 98 has a resistance of at least 0.5 kOhm, and usually greater than 1.5 kOhm, e.g. 2.2 kOhm. Processor 82 commands switch 95 to become reconfigured so as to bypass limiting resistor 98 and to deliver the relatively high level current received from first terminal member 83 to second terminal member 85 in order to activate the electrically active component, in response to receiving a triggering signal from one of the sensors. Switching unit 92 also preferably comprises an opto-isolator, generally in the form of LED 91 for generating light in cooperation with phototransistor 94, to prevent voltage surges.

In this fashion, a circuit suitable for generating a child initiated, sensor responsive triggering action may be advantageously built by detachably interconnecting blocks without need of a separate data source. As IC 89 generally housed within the interface element of an electrically switchable block is located within the path of current between first terminal member 83 and second terminal member 85, and also is switchable from a dormant state to an active state in response to a signal received from a sensor, an unlimited number of switching actions may be repeatedly performed. A prior art circuit building system that lacks a separate data source is subject to a risk that the flow of current will be disrupted after a switching action.

Any type of circuit may be built with the circuit building system of the present invention, whether series circuits, parallel circuits, or a combination thereof. Any number of interconnectable blocks and electrically active components may be employed, to provide user selected structures and user selected triggered actions while serving as an educational tool by which each block, generally comprising a single electric component, may be identified, isolated and detached.

While some embodiments of the invention have been described by way of illustration, it will be apparent that the invention can be carried out with many modifications, variations and adaptations, and with the use of numerous equivalents or alternative solutions that are within the scope of persons skilled in the art, without exceeding the scope of the claims.

The invention claimed is:

1. A circuit building system, comprising:
    a plurality of electrically conductive and detachably and mechanically interconnectable blocks that extend between a low voltage power source and one or more electrically active members and that are selectively interconnected in such a way to build a closable electric block-defined circuit through which current is flowable to activate said one or more electrically active members and by which a triggerable action is generatable without need of an independent data line in addition to the power source,
    wherein a first block of said plurality of electrically conductive blocks is an electrically switchable block that comprises:
        first and second electrically conductive terminal members by which said activating current, in response to said triggerable action, is selectively flowable to an adjacent block of the plurality of blocks in abutting and electricity conducting relation therewith;
    wherein the switchable block comprises an operating mechanism responsive to the triggerable action for permitting flow of the activating current between the first and second terminal members;

wherein the operating mechanism comprises:
an integrated circuit configured with logic circuits that are operable in both a dormant state and an active state, the activating current being transmitted by the operating mechanism between the first and second terminal members at a magnitude that is sufficient to activate the one or more electrically active members when the logic circuits are set to the active state; and
wherein leakage current is continuously flowable through the block-defined circuit, when the logic circuits are set to the dormant state, at a magnitude that is less than what is needed to activate the one or more electrically active members but sufficiently high to enable performance of the triggerable action when a triggering command is received by the logic circuits.

2. The circuit building system according to claim 1, wherein the integrated circuit comprises a processor, a switching unit interposed between the first and second terminal members and also connected to said processor, and a limiting resistor which has a sufficiently high resistance to reduce the current received from the first terminal member and transmitted to the second terminal member to the dormant state magnitude.

3. The circuit building system according to claim 2, wherein the processor is operable to transmit a reconfiguring command to the switching unit for bypassing the limiting resistor such that the activating current is received by the second terminal member.

4. The circuit building system according to claim 2, wherein the triggerable action is sensor responsive such that the triggering command is transmittable from a sensor to the processor.

5. The circuit building system according to claim 4, wherein the sensor is housed within a fourth block which is interconnectable with the first block.

6. The circuit building system according to claim 4, wherein the sensor is housed within the first block.

7. The circuit building system according to claim 2, further comprising a short-range receiver in data communication with the logic circuits to which the triggering command is remotely transmittable.

8. The circuit building system according to claim 7, wherein the short-range receiver is provided with the integrated circuit.

9. The circuit building system according to claim 7, wherein the short-range receiver is housed within a third block which is interconnectable with the first block.

10. The circuit building system according to claim 7, wherein the short-range receiver is a transceiver.

11. The circuit building system according to claim 1, wherein the triggerable action is user initiated.

12. The circuit building system according to claim 1, wherein a second block of the plurality of electrically conductive blocks comprises the first and second terminal members and one or more contact enhancing elements, to maintain an adjacent first or second block in abutting and electricity conducting relation with each other.

13. The circuit building system according to claim 12, wherein the second block has a central portion made from a non-conductive material in order to electrically isolate the first and second terminal members from each other.

14. The circuit building system according to claim 1, wherein a second block of the plurality of electrically conductive blocks is a wholly conductive block, and further comprises one or more contact enhancing elements, to maintain an adjacent first or second block in abutting and electricity conducting relation with each other.

15. The circuit building system according to claim 1, wherein each of said plurality of blocks is configured with a single electric component of the electric block-derived circuit that is identifiable and isolatable.

16. The circuit building system according to claim 1, wherein the low voltage power source is a battery or a DC transformer.

17. The circuit building system according to claim 1, wherein the electric block-defined circuit comprises a plurality of parallel sub-circuits, each of said plurality of sub-circuits comprising a corresponding electrically switchable block by which the activating current is selectively deliverable therethrough.

18. The circuit building system according to claim 17, wherein a first sub-circuit comprises a first electrically active member that is different than a second electrically active member associated with a second sub-circuit.

19. The circuit building system according to claim 1, wherein the triggering command is selected from the group consisting of a sound trigger, a light trigger and a magnetic field trigger.

* * * * *